US006828068B2

(12) United States Patent
Progler et al.

(10) Patent No.: US 6,828,068 B2
(45) Date of Patent: Dec. 7, 2004

(54) BINARY HALF TONE PHOTOMASKS AND MICROSCOPIC THREE-DIMENSIONAL DEVICES AND METHOD OF FABRICATING THE SAME

(75) Inventors: Christopher J. Progler, Plano, TX (US); Peter Rhyins, Prosper, TX (US)

(73) Assignee: Photronics, Inc., Brookfield, CT (US)

( * ) Notice: Subject to any disclaimer, the term of this patent is extended or adjusted under 35 U.S.C. 154(b) by 76 days.

(21) Appl. No.: 10/349,629

(22) Filed: Jan. 23, 2003

(65) Prior Publication Data

US 2003/0138706 A1 Jul. 24, 2003

(51) Int. Cl.[7] .............................................. G03F 9/00
(52) U.S. Cl. ....................................................... 430/5
(58) Field of Search .......................... 430/5, 322, 323; 358/3.13; 716/19, 21

(56) References Cited

U.S. PATENT DOCUMENTS

| | | |
|---|---|---|
| 5,310,623 A | 5/1994 | Gal |
| 5,415,727 A | 5/1995 | Gal et al. |
| 5,420,720 A | 5/1995 | Gal et al. |

(List continued on next page.)

OTHER PUBLICATIONS

Henke, W., et al., "Simulation and experimental study of gray–tone lithography for the fabrication of arbitrarily shaped surfaces," IEEE, 1994, 205–210.
Kley, E.–B., et al., "Fabrication of micro optical surface profiles by using gray scale masks," SPIE, 1998, 254–262, vol. 3276.
Reimer, K., et al., "Micro–optic fabrication using one–level gray–tone lithography," SPIE, 1997, 279–288, vol. 3008.
Reimer, K., et al., "Fabrication of Microrelief Surfaces using a One–Step Lithography Process," SPIE, 1997, 2–10, vol. 3226.
Reimer, K., et al., "Progress in Graytone Lithography and Replication Techniques for Different Materials," SPIE, 1999, 98–105, vol. 3879.

(List continued on next page.)

*Primary Examiner*—S. Rosasco
(74) *Attorney, Agent, or Firm*—Amster, Rothstein & Ebenstein LLP

(57) ABSTRACT

The present invention generally relates to improved binary half tone ("BHT") photomasks and microscopic three-dimensional structures (e.g., MEMS, micro-optics, photonics, micro-structures and other three-dimensional, microscopic devices) made from such BHT photomasks. More particularly, the present invention provides a method for designing a BHT photomask layout, transferring the layout to a BHT photomask and fabricating three-dimensional microscopic structures using the BHT photomask designed by the method of the present invention. In this regard, the method of designing a BHT photomask layout comprises the steps of generating at least two pixels, dividing each of the pixels into sub-pixels having a variable length in a first axis and fixed length in a second axis, and arraying the pixels to form a pattern for transmitting light through the pixels so as to form a continuous tone, aerial light image. The sub-pixels' area should be smaller than the minimum resolution of an optical system of an exposure tool with which the binary half tone photomask is intended to be used. By using this method, it is possible to design a BHT photomask to have continuous gray levels such that the change in light intensity between each gray level is both finite and linear. As a result, when this BHT photomask is used to make a three-dimensional microscopic structure, it is possible to produce a smoother and more linear profile on the object being made.

92 Claims, 14 Drawing Sheets

BHT Mask Fabrication

U.S. PATENT DOCUMENTS

| | | |
|---|---|---|
| 5,444,572 A | 8/1995 | Gal et al. |
| 5,450,241 A | 9/1995 | Gal et al. |
| 5,463,498 A | 10/1995 | Gal et al. |
| 5,471,345 A | 11/1995 | Gal et al. |
| 5,480,764 A | 1/1996 | Gal et al. |
| 5,482,800 A | 1/1996 | Gal |
| 5,497,269 A | 3/1996 | Gal |
| 6,335,151 B1 | 1/2002 | Ausschnitt et al. |
| 6,406,818 B1 | 6/2002 | Zemen et al. |
| 6,638,667 B2 * | 10/2003 | Suleski et al. .............. 430/5 |
| 2004/0080790 A1 * | 4/2004 | Abe ........................ 358/3.13 |

OTHER PUBLICATIONS

Reimer, K., et al., "One–level gray–tone lithography—mask data preparation and pattern transfer," SPIE, 1996, 71–79, vol. 2783.

Wagner, B., et al., "Microfabrication of complex surface topographies using grey–tone lithography," Sensors and Actuators A, 1995, 89–94.

* cited by examiner (PRIOR ART)

BINARY HALF TONE PHOTOMASKS AND MICROSCOPIC THREE-DIMENSIONAL DEVICES AND METHOD OF FABRICATING THE SAME

FIELD OF THE INVENTION

The present invention generally relates to binary half tone ("BHT") photomasks and three-dimensional microscopic structures (e.g., micro-electromechanical systems ("MEMS"), micro-optics, photonics, micro-structures, imprint lithography applications and other devices) and a method for designing and fabricating the same.

BACKGROUND OF THE INVENTION

Recent technological advances have made it possible to use three-dimensional MEMS, micro-optical devices and other micro-structures in a variety of fields, including photonics, communications, and integrated circuits. In the past, these tiny devices were fabricated using laser micro-machining tools. However, this method was time consuming and expensive, and thus, it was typically difficult for manufacturers to meet production requirements in a cost efficient manner. In this regard, such techniques did not work well with commonly applied techniques for manufacturing integrated circuits because each pixel of the design had to be rewritten using a new algorithm. Since this was a laborious and time-consuming undertaking, many have avoided the use of micro-machining tools.

In light of the desirability to use small scale, three-dimensional structures, other manufacturing techniques have been developed in an attempt to avoid the problems associated with laser micro-machining tools. In particular, traditional optical lithography techniques used for fabricating integrated circuits have been adapted to manufacture three-dimensional microstructures. In traditional optical lithography, a fully resolved pattern is etched into a binary photomask and transferred to a wafer by exposing the wafer through an exposure tool (e.g., stepper). More particularly, binary photomasks are typically comprised of a substantially transparent substrate (e.g., quartz) and an opaque layer (e.g., chrome) in which the pattern to be transferred is etched. It is also known that other layers may be included on the photomask, including, for example, an antireflective layer (e.g., chrome oxide). The photoresist in the substrate on the integrated circuit being processed is then developed and either the exposed or unexposed portions are removed. Thereafter, the material on the substrate is etched in the areas where the photoresist is removed. An example of the technology involved in manufacturing a traditional binary photomask (e.g., chrome-on-quartz) and its use to manufacture integrated circuits is disclosed in, for example, U.S. Pat. No. 6,406,818.

These known processes for fabricating binary photomasks and semiconductor devices have been modified for the manufacture of three-dimensional, microscopic devices. In this regard, it is known to use a continuous tone pattern on the photomask (e.g., chrome-on-glass) instead of a binary, fully resolved mask pattern to yield a continuous tone intensity through the photomask during image formation. One type of continuous tone, variable transmission photomask is commonly known as a binary half tone ("BHT") photomask. BHT photomasks use two levels of gray tones (e.g., 0% transmissive and 100% transmissive). Another type of continuous tone, variable transmission photomask is known as gray scale photomasks, which use varying levels of transmission of light through the photomask (e.g., 0%, 50%, 100%, etc.). By using these types of variable transmission photomasks, a three-dimensional structure can be formed in the photoresist on a wafer through the use of a continuous tone pattern.

BHT photomasks are typically designed to have sub-resolution features that partially transmit exposure source light intensity based on feature modulation in width and pitch. In this regard, it is known in the art to design a BHT photomask layout for microscopic surfaces by dividing the patterned area of the photomask into pixels and sub-pixels (commonly referred to as "sub-pixelation") which define areas on the mask through which light is to be transmitted, as shown in FIGS. 1 and 2. The sub-pixels defining the BHT photomask pattern are designed to be smaller than the resolution of the exposure tool being used so that a gray scale image can be created on the resulting wafer. The boundaries of the sub-pixel's size are typically defined by Rayleigh's equation (1) as follows:

$$R = k\lambda/NA \qquad (1)$$

where R is the minimum resolvable half pitch feature of the wafer, $\lambda$ is the exposure tool wavelength, NA is the numerical aperture of the optical system of the exposure tool being used and k (k factor) is a unitless constant whose value depends on process capability (e.g., the smaller the k factor, the better low contrast aerial images can be seen). Generally speaking, the sub-pixels that are required by gray scale designs need to be unresolved in the imaging system, and thus, the k factor should preferably be less than 0.5. As a practical matter, however, the k factor can be somewhat greater than 0.5 and still be unresolved by the total process for some exposure tools. Photomask designers have used calibrated simulation tools, such as the Prolith/2 manufactured by KLA-Tencor, to converge on the optimum unresolvable feature size. Unfortunately, there are many other tools which do not meet the requirements of equation (1), and thus, the design of the photomask is often limited by the capabilities of the design tools available to the designer. Moreover, since photomasks are commonly designed to include other structures (e.g., two dimensional, binary components such as integrated circuit patterns) in addition to a three-dimensional device (e.g., photonics application), this problem is even more complex than implied by the above equation. In such cases, certain BHT cell designs may involve isolated spaces in chrome or chrome islands on the mask and the notion of half pitch is not defined.

As understood by those skilled in the art, tolerable surface roughness effects the minimum feature size in the device under fabrication. For example, where the k factor is 0.7 in equation (1) (i.e., the minimum feature size is resolvable by the optical system), an attempt to construct a BHT photomask having a step-ramp layout will result in a sub-ripple within each step of the ramp pattern, as shown in FIG. 3. In some applications where the specifications of the device permit, a ripple-effect may be acceptable, albeit undesirable. However, in many applications, a sub-ripple effect is not acceptable since a smoother profile is needed for optimal performance of the device being fabricated. Since the prior art BHT photomask design requires the use of a small k factor to achieve a smoother profile, the mask designer is limited to equipment meeting this requirement.

In addition to the k factor, the design of a BHT photomask layout is governed by other specifications of the optical lithography equipment being used, including, for example, its resolution, magnification, wavelength, etc. In this regard, known gray scale applications, such as micro-optical surface generation, require data to have a higher resolution than what is typical of most mask pattern generators. As a result, the mask designer is limited to only those write tools that have the ability to match the gray level grid design associated therewith. For example, an electron beam write tool such as the MEBES 4500, with a write grid of 20 nm cannot properly replicate a BHT design whose sub-pixel variations is 10 nm. A laser beam write tool, by contrast, such as the ALTA 3500 having a write address of 5 nm is capable of replicating the same design.

Moreover, an imaging solution requiring custom materials at the mask will often add cost and complexity in the overall manufacturing process due to the difficulties typically associated with integrating new materials into a photomask. For example, it is known in the art to use variable attenuating films ("VAF"), rather than a BHT photomask, to make three-dimensional devices. However, VAFs are typically expensive and yield less than desirable results.

Once the mask pattern design is completed, the design is transferred to the photomask using optical lithography methods similar to those used to process a conventional binary photomask, as shown in FIG. 4. More particularly, a binary photomask having photoresist 51, chrome 53 and quartz 55 layers is placed under a photomask pattern generator. The photoresist layer 51 is exposed to an optical, laser, electron beam or other write tool in accordance with the data file defining the BHT photomask. The exposed portions of the photoresist layer 51 are developed (i.e., removed) to expose the underlying chrome portions of the chrome layer 53. Next, the exposed chrome portions are etched away (e.g., by dry plasma or wet etching techniques). Thereafter, the remaining photoresist 51 is removed to form a completed BHT photomask in accordance with the BHT photomask layout.

The variable intensity gray tone pattern defined by the mask is next transferred to a wafer coated with photoresist using a wafer stepper or other optical lithography tools. More specifically, varying light intensities are exposed to portions of photoresist on the wafer as defined by the openings in the BHT photomask. The photoresist, in turn, exhibits changes in optical density and a gray scale profile is created thereon. It is noted, however, that the photoresist process is often limited to the variable dose pattern generator being used. Next, the exposed photoresist is removed and the remaining photoresist forms a gray scale pattern which corresponds to the mask design. The photoresist and wafer are then etched to predetermined depths to conform to the gray scale pattern. The result is a three-dimensional microstructure on the wafer.

In the known methods described above, the minimum feature size suiting the needed application (e.g., three-dimensional microscopic structure) is determined through known simulation techniques, by experimentation or other methods. Once the minimum feature size is determined, a pixel defining the mask dimensions is generated. Various methods have been applied to array a gray scale design (e.g., squares, pixels or spots using variable pitch and variable sub-pixelation methods). These methods, however, have their limitations. In this regard, it is known that contact hole and spot features are more difficult to control than line and space features. As a result, both corner rounding and linearity of the design are compromised. Similarly, variable pitch methods are problematic since they require a different algorithm to be applied at each pixel position to carefully define the correct opening in the BHT mask. When considering the dynamic range for the layout, the square pixel changes non-linearly since the size is varied over the contact area. This can limit the ability of a mask designer to make the fine changes required to correct for process non-linearity. These methods add to the costs and processing time in preparation of the mask since they require a large number of adjustments to be made to the overall design.

One example of a known method for designing a BHT photomask is described in U.S. Pat. No. 5,310,623 ("the '623 patent'). The '623 patent teaches a method for fabricating microlenses through the use of a single exposure mask with precisely located and sized light transmitting openings to enable an image replica to be produced in photoresist materials, and ultimately transferred to a substrate. As disclosed, the design for the photomask is generated using three-dimensional modeling software, wherein a single pixel defines the shape of the microlens. The single pixel is sub-divided into "sub-pixels", which in turn are sub-divided into gray scale resolution elements. Each sub-pixel and gray scale resolution elements is designed to be "equal [in] size" on each side. (Col. 6, line 30). In other words, each sub-pixel and gray scale element is a perfect square.

U.S. Pat. No. 6,335,151 discloses a method for fabricating a microscopic, three-dimensional object by creating a mask having consisting of pixels and "super-pixels" which define the contours of the object's surface, imaging the mask's pattern onto a photoresist film, and transferring the three-dimensional surface from the photoresist to a substrate.

Although useful, the conventional square pixel array methods used in the prior art have their shortcomings. In this regard, the prior art discloses the use of square pixels having a size which is less than the minimum resolvable feature size of an optical system. Each pixel is then divided into sub-pixels whose respective areas are changed in both the x and y axes, as disclosed in the '151 and '623 patents. As a result, the change in area of each sub-pixel is a square of the amplitude, thereby making the change in light intensity between each gray level non-linear and often infinite. Thus, the transmission of light is limited by the square sub-pixel's size as well as the minimum dimensions permitted by the mask pattern generator. Accordingly, three-dimensional objects made by the prior art methods tend to have jagged surfaces, especially where the objects are sloped. Since these methods produce marginal results, many have migrated away from the use of BHT photomasks for making three-dimensional microscopic devices.

Thus, there is a long felt need for new design rules and layout choices for making BHT photomasks to overcome these shortcoming associated with the prior art.

While the prior art is of interest, the known methods and apparatus of the prior art present several limitations which the present invention seeks to overcome.

In particular, it is an object of the present invention to provide a method for designing a BHT photomask layout having a smooth profile.

It is a further object of the present invention to provide a method for designing a BHT photomask layout which meets the specifications of a wide range of optical systems.

It is another object of the present invention to design a BHT photomask wherein the change in light intensity between each gray level is both linear and finite.

It is another object of the present invention to solve the shortcomings of the prior art.

Other objects will become apparent from the foregoing description.

SUMMARY OF THE INVENTION

It has now been found that the above and related objects of the present invention are obtained in the form of a BHT photomask and microscopic three-dimensional structure and method for designing and fabricating the same. The method for designing the layout of BHT or gray scale photomasks is governed by specific design rules calculated within an electronic database.

More particularly, the present invention is directed to a binary half tone photomask comprising a substantially transparent substrate and an opaque layer having a pattern formed therein. The pattern is defined by at least one pixel, wherein each pixel is divided into sub-pixels having a variable length in a first axis and fixed length in a second axis. In one embodiment of the present invention, the pixel is a square and the sub-pixels have a height and a length, wherein th height of each of the sub-pixels is approximately one half of the pixel's pitch and the length of each sub-pixel is linearly varied in opposite directions along one axis only. In another embodiment, the pixel is circular and the sub-pixels have a radius and an arc length, wherein the radius of each of the sub-pixels is approximately one half of the pixel's pitch and the arc length of each sub-pixel being linearly varied in opposite directions along one axis only.

The present invention is also directed to a method for designing a layout of a binary half tone photomask pattern to be used to fabricate a three-dimensional structure. This method comprises the steps of generating at least two pixels, dividing each of the pixels into sub-pixels having a variable length in a first axis and fixed length in a second axis, and arraying the pixels to form a pattern for transmitting light through the pixels so as to form a continuous tone, aerial light image. In a preferred embodiment, the sub-pixel's area is smaller than the minimum resolution of an optical system of an exposure tool with which the binary half tone photomask is intended to be used.

Additionally, the present invention is directed to a method for making a binary half tone photomask. This method comprises the step of providing a binary photomask comprising a photoresist layer, an opaque layer and a substantially transparent layer in a lithography tool. Additionally, the photoresist layer is exposed to the lithography tool in accordance with a binary half tone photomask pattern on the photomask, wherein the pattern is defined by at least one pixel. Each pixel is divided into sub-pixels having a variable length in a first axis and fixed length in a second axis. Next, undesired portions of the photoresist and portions of the opaque layer underlying the removed photoresist portions are etched. Thereafter, the remaining portions of the photoresist layer are removed. Here again, each sub-pixel's area is preferably smaller than the minimum resolution of an optical system of an exposure tool with which the binary half tone photomask is intended to be used.

The present invention is also directed a microscopic three-dimensional structure made in accordance with the methods described above. In this regard, the three-dimensional structure comprises a wafer having a continuous tone, substantially linear and smooth surface, wherein the surface of the wafer corresponds to the shape of a light aerial image generated from a binary half tone photomask. The binary half tone photomask comprises a pattern formed therein which is defined by at least one pixel, wherein each pixel is divided into sub-pixels having a variable length in a first axis and fixed length in a second axis. Here again, each sub-pixel preferably has an area that is smaller than the minimum resolution of an optical system of an exposure tool with which the binary half tone photomask is intended to be used.

The present invention is also directed to a method for fabricating a three-dimensional microscopic structure in accordance with the methods described above. In this regard, the method for fabricating a three dimensional structure comprises the step of providing a binary half tone photomask between an exposure tool and a wafer coated with a photoresist layer. The binary half tone photomask comprises a substantially transparent substrate and an opaque layer having a pattern formed therein. The pattern is defined by at least one pixel, wherein each pixel is divided into sub-pixels having a variable length in a first axis and fixed length in a second axis. The sub-pixels' area is preferably smaller than the minimum resolution of an optical system of an exposure tool with which the binary half tone photomask is intended to be used. Next, the photoresist layer of the wafer is exposed to the exposure tool in accordance with pattern on the binary half tone photomask. Thereafter, undesired photoresist is removed to form a three-dimensional profile in the photoresist which has not been removed. Next, the wafer is etched to a predetermined depth to correspond in shape to the three dimensional profile formed in the remaining photoresist. Thereafter, the remaining photoresist is removed.

In another embodiment of the present invention, a method for making step and flash templates is provided. This method comprises the step of providing a binary photomask having a photoresist layer, an opaque layer and substantially transparent in a lithography tool. The photoresist layer is exposed to a lithography tool in accordance with a binary half tone photomask pattern defined by at least one pixel, wherein each pixel is divided into sub-pixels having a variable length in a first axis and fixed length in a second axis. The sub-pixels' area is preferably smaller than the minimum resolution of an optical system of an exposure tool with which the binary half tone photomask is intended to be used. Next, undesired portions of the photoresist is removed from the photomask and portions of the chrome layer underlying the removed photoresist portions are etched away. Thereafter, remaining portions of the photoresist layer are removed and the pattern in the binary half tone photomask is transferred to a second substrate to produce a continuous tone pattern defined by the photomask thereon. The second substrate is preferably made from a rigid material, including, but not limited to, fused silica, glass, metals, crystalline structures, plastics or other similar materials. The second substrate may then be used as an imprinting or stamping plate for fabricating imprint lithography applications.

Another embodiment of the present invention is directed to a gray scale photomask made in accordance with the methods described herein. The gray scale photomask comprises a substantially transparent substrate and an opaque layer having a pattern formed therein. The pattern is defined by at least one pixel, wherein each pixel is divided into sub-pixels having a variable length in a first axis and fixed length in a second axis. The sub-pixels' area is preferably smaller than the minimum resolution of an optical system of an exposure tool with which the binary half tone photomask is intended to be used.

BRIEF DESCRIPTION OF THE DRAWINGS

The above and related objects, features and advantages of the present invention will be more fully understood by reference to the following, detailed description of the preferred, albeit illustrative, embodiment of the present invention when taken in conjunction with the accompanying figures, wherein.

DETAILED DESCRIPTION OF THE INVENTION

Figure 1:
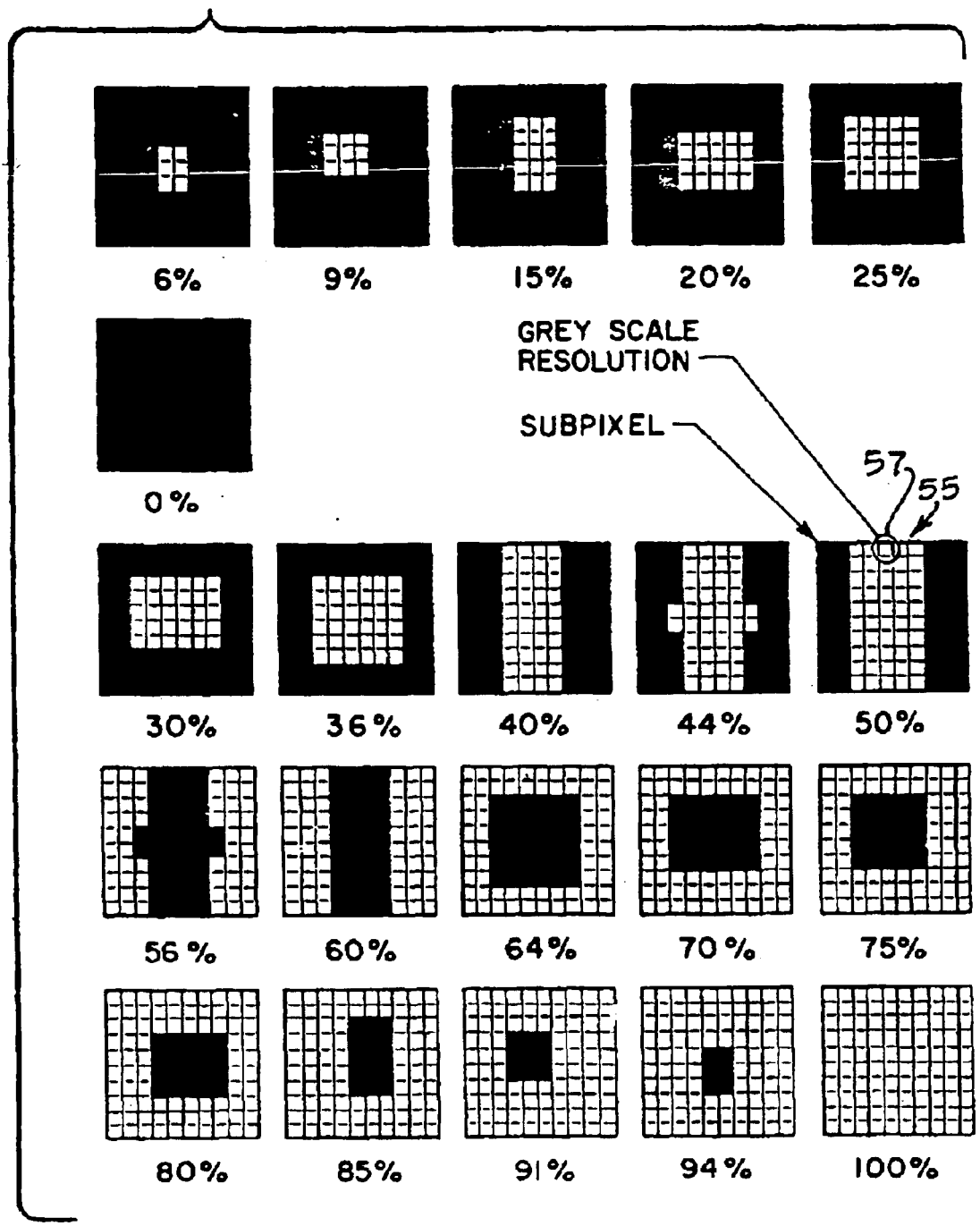
FIGS. 1 and 2 illustrate examples of BHT photomask patterns known in the prior art.
Figure 2:
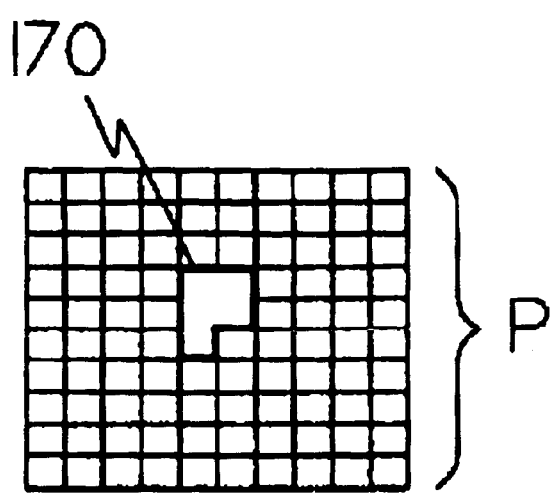
Figure 3:
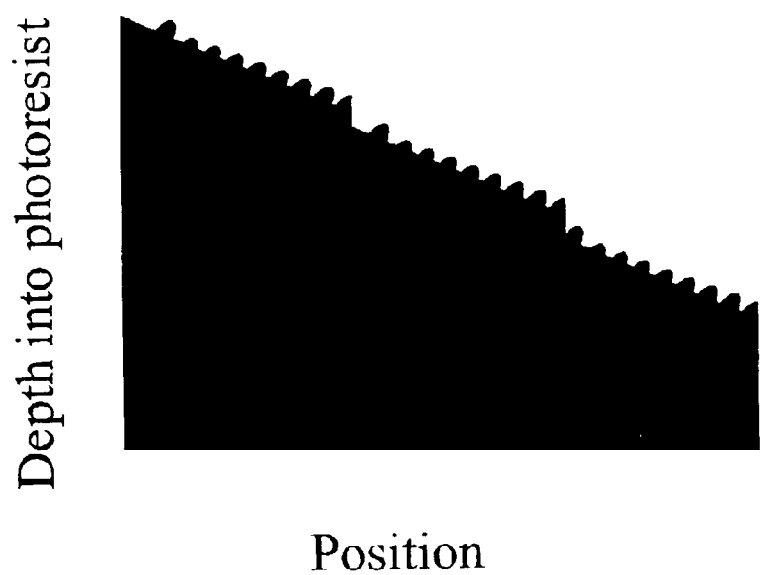
FIG. 3 illustrates the ripple effect that results from a step-ramp layout designed in accordance with prior art sub-pixelation methods, such as those shown in FIGS. 1 and 2.

The present invention generally relates to improved BHT photomasks and microscopic three-dimensional structures made from such photomasks. The present invention is also directed toward a method for designing and fabricating BHT photomasks to be used in creating such microscopic three-dimensional structures (e.g., MEMS, micro-optics, photonics, micro-structures and other three-dimensional, microscopic devices). More particularly, the present provides a method for designing a BHT photomask layout, transferring the layout to a BHT photomask and fabricating three-dimensional microscopic structures using the BHT photomask designed by the method of the present invention. As will be seen below, the method of the present invention enables a photomask designer to design a BHT photomask to have continuous gray levels such that the change in light intensity between each gray level is both finite and linear. As a result, when this BHT photomask is used to make a three-dimensional microscopic structure, it is possible to produce a smoother and more linear profile on the object being made. Likewise, it has been found that BHT photomasks designed in accordance with the method of the present invention meet the sub-resolution requirements of most, if not all, optical tools. Each aspect of the present invention is now described.

The first aspect of the present invention is directed to the method by which the design for a BHT photomask is generated. More particularly, the method of the present invention implements specific design rules calculated within an electronic database to generate a photomask pattern which achieves substantially linear changes in variable light intensity when transmitted through the photomask.

More particularly, the BHT photomask design method of the present invention uses a series of pixels, preferably either square or circular, whose area is varied in a manner so as to avoid the limitations of the resolution of the mask pattern generator being used. (While square or circular pixels are preferred, the present invention is not so limited, and may apply to other shaped pixels, such as oval shaped, rectangular, etc.). In a preferred embodiment, a pixel 19 is generated such that its area is larger than the minimum resolution of the mask pattern generator being used. Thereafter, each pixel 19 is divided into two half-pixels, such as sub-pixels 21a and 21b, as shown in FIGS. 5a–b and 6a–b. Each sub-pixel 21a and 21b has a height h (in the case of a square pixel, see FIGS. 5a–b) or radius r (in the case of a circular pixel, see, FIGS. 6a–b), wherein the height h or radius r for each sub-pixel 21a and 21b is a fixed length. In one embodiment, the height h or radius r of each sub-pixel 21a and 21b, as the case may be, is equal to approximately one-half of the pitch p of pixel 19. It is noted, however, that the height h or radius r (as the case may be) of the sub-pixels 21a and 21b can be divided into other fixed lengths, including, but not limited to, the following arrangements: height h or sub-pixel 21a is one-third of the pitch of the pixel 19 and sub-pixel 21b is two-thirds of the pitch of pixel 19, or vice versa; height h or sub-pixel 21a is one-fourth of the pitch of the pixel 19 and sub-pixel 21b is three-fourths of the pitch of pixel 19, or vice versa; etc. In this regard, the height h or radius r of each sub-pixel 21a and 21b should be divided in a manner such that their total pitch, when added together, is equal to the pitch of the pixel 19 from which they were divided. Next, the length l (in the case of a square pixel) or arc θ (in the case of a circular pixel) of each sub-pixel is varied in opposite directions along one axis only, in a staggered arrangement to either increase or decrease the total area of the full pixel, depending upon the particular pattern design being generated, as shown in FIGS. 5a–b and 6a–b, respectively. In this regard, the area of each sub-pixel 21a and 21b should be linearly varied to an amount that is equal to or less than the minimum resolvable pitch of the optical system of the exposure tool being used. Additionally, where only a small number of sub-pixels are arrayed to form the BHT photomask design, it is preferable that the pixels 19 are sized to meet the minimum resolution of the exposure tool being used to ensure that the sub-pixels 21a and 21b will not be resolved during the image writing process, and thus, avoid the sub-ripple effects exhibited by the prior art. Each modified pixel 19 is hereinafter referred to as a Half-Pitch Expansion Cell ("HPEC"). This process is repeated, with a series of HPECs being arrayed in a manner to reflect the design of the three-dimensional device to be fabricated. By arraying the HPECs in this manner, continuous gray levels are created such that the change in light intensity between each gray level (i.e., amplitude) is both linear and finite. In this regard, since the number of possible gray levels in the patterned array is increased by this method, the BHT mask design achieves a substantially continuous, variable pixel size from the maximum opening to the smallest opening to yield 100% to 0% transmission through the mask. As a result, smoother surfaces are created on the three-dimensional object being formed with the BHT photomask.

The arrayed design is created as a hierarchical, two-dimensional image written within a Computer Aided Design ("CAD") system. Any CAD tool having all-angle polygon capability can be used to write the pixels 19 for the purposes of the present invention. One example of an appropriate a mask pattern generator to write a pixel is the L-Edit CAD tool by Tanner EA.

The hierarchical design created with the method of the present invention incorporates a layer for each gray level and allows each HPEC to be arrayed uniquely from other gray levels. This hierarchical design is used to compile a mask pattern generator file for writing the BHT pattern on a photomask, with the hierarchy being maintained in such file. By using this method, the mask pattern generator file size remains very small compared to one that has been flattened where all gray level pixels are within a single layer, as is the case using prior art methods. As a result, it is possible to achieve a quicker write time, thereby reducing the cost to manufacture the photomask. Furthermore, it has been found that BHT layouts designed by the method of the present invention are more easily arrayed with a repeating symmetry that lends well to polar and orthogonal arrays without interference from one sub-pixel to another. In this regard, unlike the prior art, which required a pattern to be rewritten each time it was transferred to a wafer, the method of the present invention allows a pattern to be transferred in a serial manner once it is arrayed. This too results in faster processing time to manufacture the resulting devices, and thus, greater throughput.

Furthermore, by forming the HPECs in accordance with the method of the present invention, the sub-pixels 21$a$ and 21$b$ should be below the minimum resolution of most optical systems of exposure tools. Thus, unlike the prior art, the BHT design made in accordance with the present invention is limited only by the CAD tool design grid that is chosen to array the mask pattern (which is typically 1 nm, but may be other sizes if desired) and the CAD tool being used. Moreover, as should be understood from the foregoing, the sub-pixels 21$a$ and 21$b$ are created as a single cell within a design having a width which can be modulated for each gray level, while at the same time maintaining a constant pitch for that gray level. Thus, when each sub-pixel 21$a$ and 21$b$ is arrayed with a layer and each gray level has an assigned layer, the single cell open area can be easily changed for the photoresist process when correction for process non-linearity are required.

Figure 4:
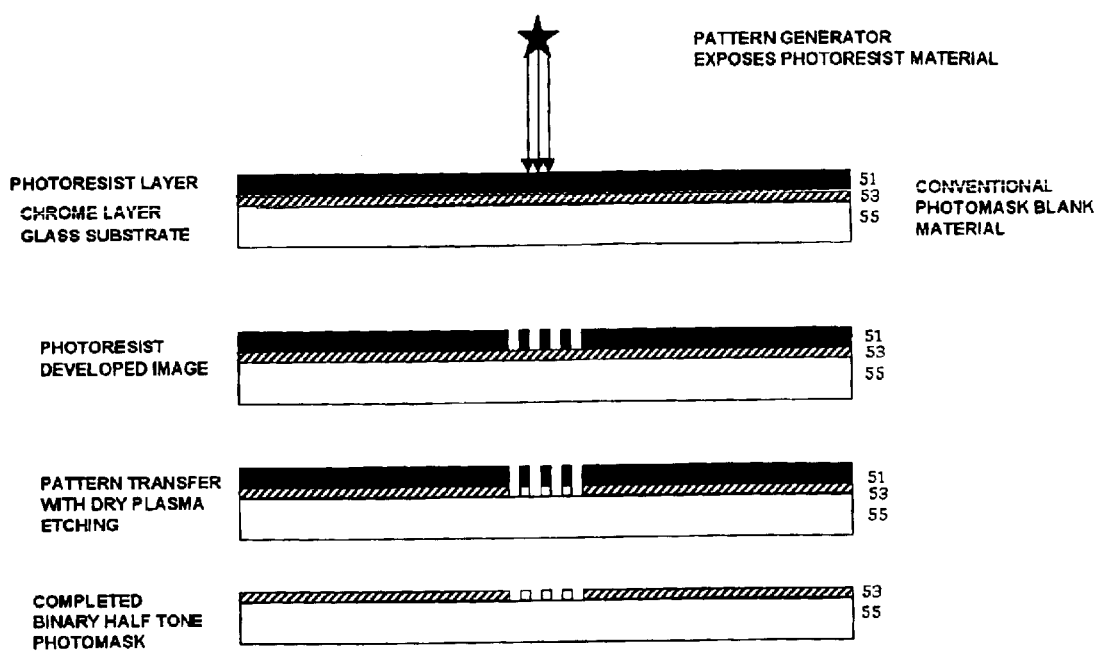
FIG. 4 illustrates the process of making BHT photomask pattern using conventional lithography techniques.
Figure 5A:
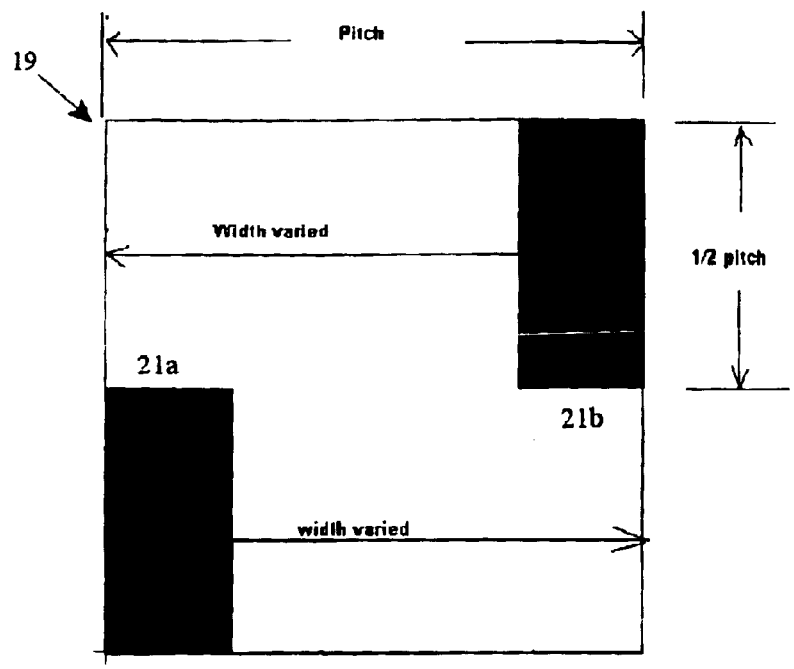
FIGS. 5a and 5b show a square pixel divided into half-pitch sub-pixels whose area is varied along one axis only in accordance with the method of the present invention.
Figure 5B:
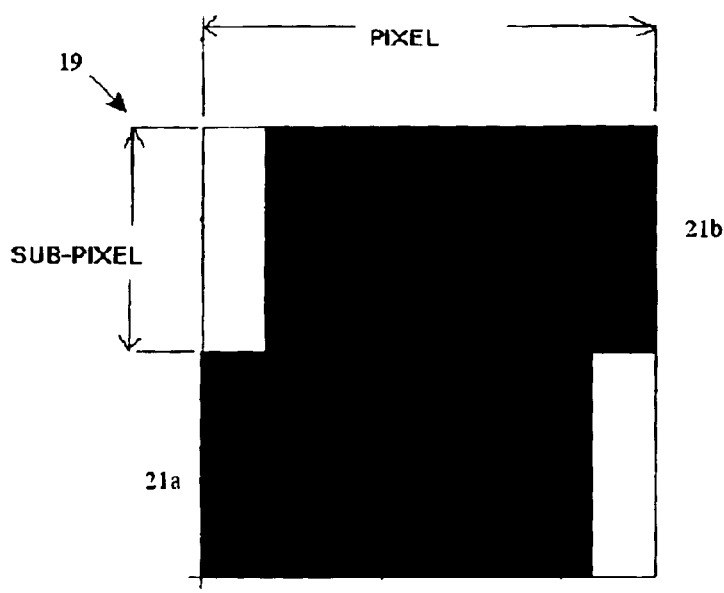

In the second, related aspect of the present invention, the mask pattern generator file is transferred to a photomask. In this regard, a blank photomask is made using a standard binary (e.g., chrome-on-quartz) photomask and conventional lithography techniques, as shown in FIG. 4. Preferably, the blank binary photomask is a standard chrome-on-quartz photomask coated with a photoresist layer 51. It is noted however, that the photomask may have other layers (e.g., an anti-reflective layer such as CrO) if needed or desired. To process the photomask, designated portions of the photosensitive material on the photomask are exposed to the mask pattern generator in accordance with the BHT photomask design stored in the mask pattern generator file and the exposed portions of the photoresist are removed such that the chrome portions 53 are no longer covered by the photoresist 51. Next, the uncovered chrome portions 53 are etched away using standard techniques (e.g., wet or dry etching), thereby exposing the quartz portions 55 underlying the areas of removed chrome 53. Thereafter, the remaining photoresist (i.e., the unexposed photoresist) is removed. The result is a BHT photomask having the BHT design etched thereon. The opaque portions 53 of the BHT photomask attenuates the passage of light energy through the mask such that the transmitted light will have varying intensity as governed by the photomask design.

In the third, related aspect of the present invention, the design for the three-dimensional microscopic structure is transferred from the BHT photomask to a wafer to form the desired three-dimensional structure. In this regard, the BHT photomask designed in accordance with the method of the present invention is placed between a wafer exposure tool (e.g., stepper) or other lithographic camera and a wafer having photoresist (e.g. AZ 4400) deposited thereon. Light is then transmitted from the wafer exposure tool through the openings in the BHT photomask in a uniform, substantially linear manner to produce a three-dimensional light aerial image. The photoresist on the wafer is in turn exposed to this three-dimensional aerial light image and developed to remove the exposed photoresist. As a result, a three-dimensional surface corresponding to the aerial image is formed in the photoresist. Next, the wafer is etched to a predetermined depth to correspond in shape to the developed photoresist. As a result, a three-dimensional image, defined by the BHT photomask, is formed on the wafer.

To achieve optimal linear results in designing a BHT photomask in accordance with the present invention, there are several design and processing considerations which a photomask designer should consider when designing a BHT photomask layout. In particular, the designer should consider the limitations of the CAD tool and write tool being used as well as the limitations of the wafer device being used to fabricate the three-dimensional device. Each of these considerations are discussed below. However, it is noted that there may be other design considerations (e.g., active device tolerances and system resolution needed to accurately reproduce the active device) depending upon the BHT process being used and the device being made which a photomask designer may consider.

As noted herein, a variety of different CAD tools may be used, provided that such CAD tools have all-angle capability. Thus, depending upon the CAD tool being used, the size of design grid may vary. Likewise, depending upon the mask pattern generator being used, the size of the write grid may also vary. For example, at the present time, conventional mask write grid values are typically even multiples of the design grid, both of which generally range between 5 nm and 200 nm. It should be noted, however, that the design and write grid value can also be other values (e.g., 0.1 nm, 1.5 nm, etc), including for example, non-integers, fractions, etc. In such cases, the design grid and gray level pixel size variation would need to be adjusted to fit the write tool grid in order to minimize the snap-to-grid that occurs when the design data is converted into the write tool grid format. Thus, the present invention is not limited to the write tools and write grids described herein, as these tools are merely described for exemplary purposes. In a preferred embodiment, when a BHT photomask design is patterned onto a photomask substrate, the design should be adjusted to fit the mask pattern generator write grid. In this regard, it is preferred that the size of the write grid is equal to the size of the design grid. The number of gray levels that are possible in the design is governed by the equation (2) as follows:

$$\text{\#Gray Levels for BHT photomask design} = D_y/W_g \qquad (2)$$

where $W_g$ is the writer grid value and $D_y$ is the sub-pixel size. Referring to Table 1 below, the difference in area change for a write tool address, the possible number of gray levels for a design and the pixels' critical dimensions size at the minimum energy threshold $E_o$ 10% of area is shown for both the HPECs designed in accordance with the method of the present invention as well as a conventional square pixel layout of the prior art. In this example, the pixel's size in each case is 2.5 microns.

TABLE 1

| | Variation of Pixel Area by Sizing of 1 Address Unit Write Tool Address, nm | | | | Maximum Number of Gray Levels Write Tool Address, nm | | | | Pixel CD at $E_o$ 10% of Area | |
|---|---|---|---|---|---|---|---|---|---|---|
| | 5 | 25 | 100 | 200 | 5 | 25 | 100 | 200 | X | Y |
| Half-Pitch | 0.20% | 1.00% | 4.00% | 8.00% | 400 | 80 | 20 | 10 | 500 | 1250 |
| Square | 0.80% | 3.96% | 15.36% | 29.44% | 200 | 40 | 10 | 5 | 791 | 791 |

As can be seen, when the HPEC is changed in only one axis, the change in area is a linear function in multiples of the address unit. When the square pixel is changed in both axes, the change in area is an exponential function, with the address unit being the exponent. As a result, there is a non-linear change using the square pixel method. Moreover, when the area of the HPEC is varied as described herein, the number of possible gray levels doubles for a given dynamic range as compared with the square pixel method. Additionally, the light intensity is sufficiently low at the minimum energy threshold $E_o$ such that the photoresist will be unresolvable when exposed.

In addition to considering the number of gray levels that are possible in a design, the mask designer should also consider whether it is possible to actually transfer these gray levels to the wafer device for which the BHT design is being designed. In this regard, the mask designer should determine the dynamic range (e.g., total number of gray levels of the image) that can actually be printed to the wafer device, which is governed by the equation (3) as follows:

$$\text{\#Gray Levels to be printed on wafer} = X/G_w \quad (3)$$

where x is the length of device and $G_w$ is the width of an individual gray scale region. Since the design and write grid for CAD and write tools are measured in nanometers, the sub-pixel to sub-pixel variation and the number of gray levels possible is limited only by the wafer device length X and not by the grid size $W_g$. For example, if a micro-mirror is required to be X microns in length and the height is also X microns, the resulting mirror angle will be 45 degrees after the resist exposure using a properly designed BHT photomask in accordance with the present invention.

Figure 7:
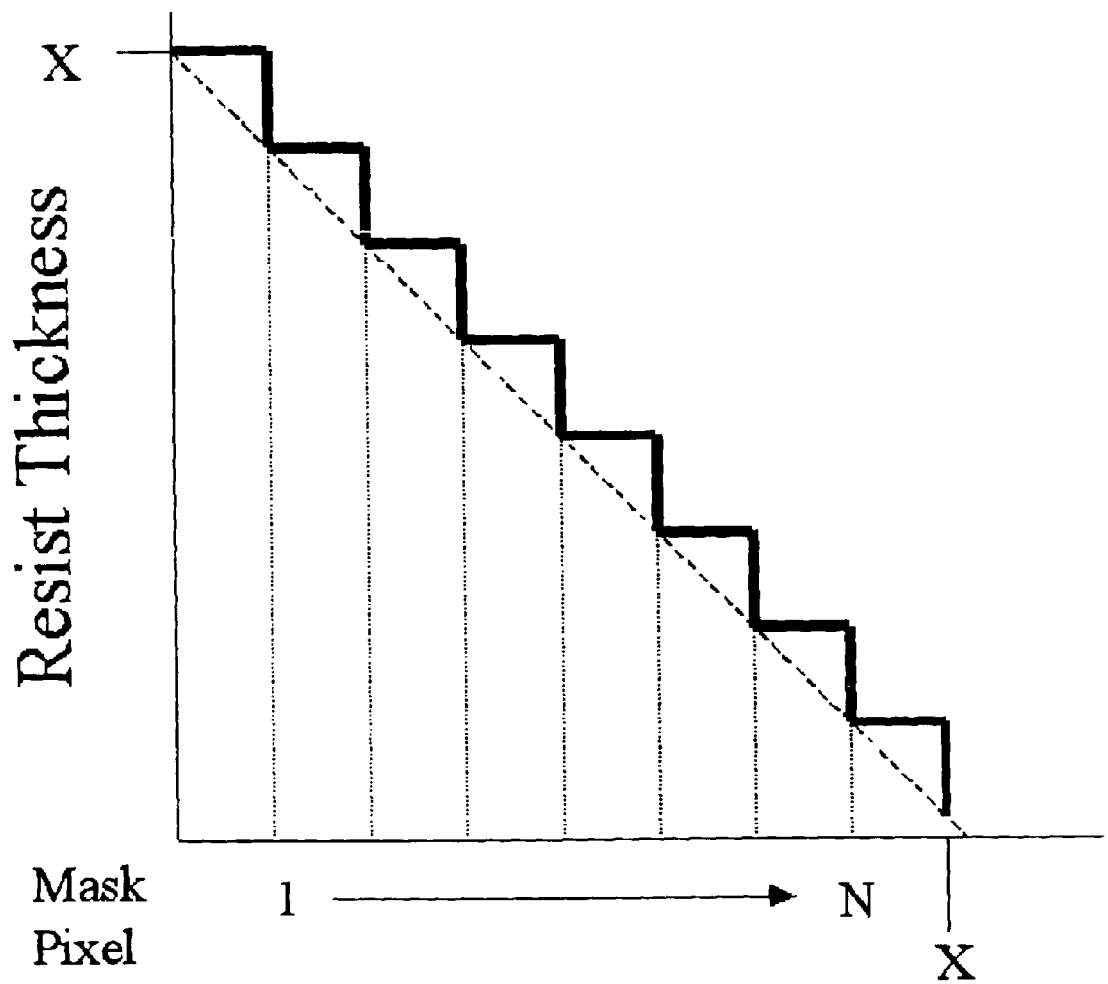
FIG. 7 shows the surface roughness of a three-dimensional device as it relates to photoresist thickness and the critical dimensions of the device.

A photomask designer should also consider the specifications for the surfaces of the micro-optical device being made. In this regard, surface roughness is a critical element in the optical efficiency of an optical component. Thus, if the number of gray levels in a photomask design is insufficient across the area of the design, the light intensity image will exhibit discrete steps that may be intolerable for the application. This problem is particularly prevalent in applications where thick photoresist is used and the device design includes rapid changes within short areas, as illustrated in FIG. 7. Thus, the photomask designer should consider the type of photoresist being used on the wafer in formulating a BHT design. In this regard, each type of photoresist process exhibits a unique response to the aerial image of an optical exposure tool. For example, various changes in the photoresist's thickness, bake conditions, dyes and absorption coefficients can change the photoresist contrast or the slope of the contour of the BHT photomask.

Accordingly, under a preferred embodiment of the present invention, the mask designer should determine the dynamic range of the photoresist process being used. The dynamic range of the photoresist process is the range of the size of sub-pixels 21$a$ and 21$b$. The dynamic range of the photoresist process should preferably vary from the minimum sub-pixel opening required to achieve the minimum energy threshold $E_o$ in the photoresist to the largest sub-opening required to achieve the maximum energy threshold $E_f$ (i.e. dose-to-clear) in the photoresist. It is within the dynamic range $E_o$–$E_f$ that the gray scale variations should be applied.

Figure 8:
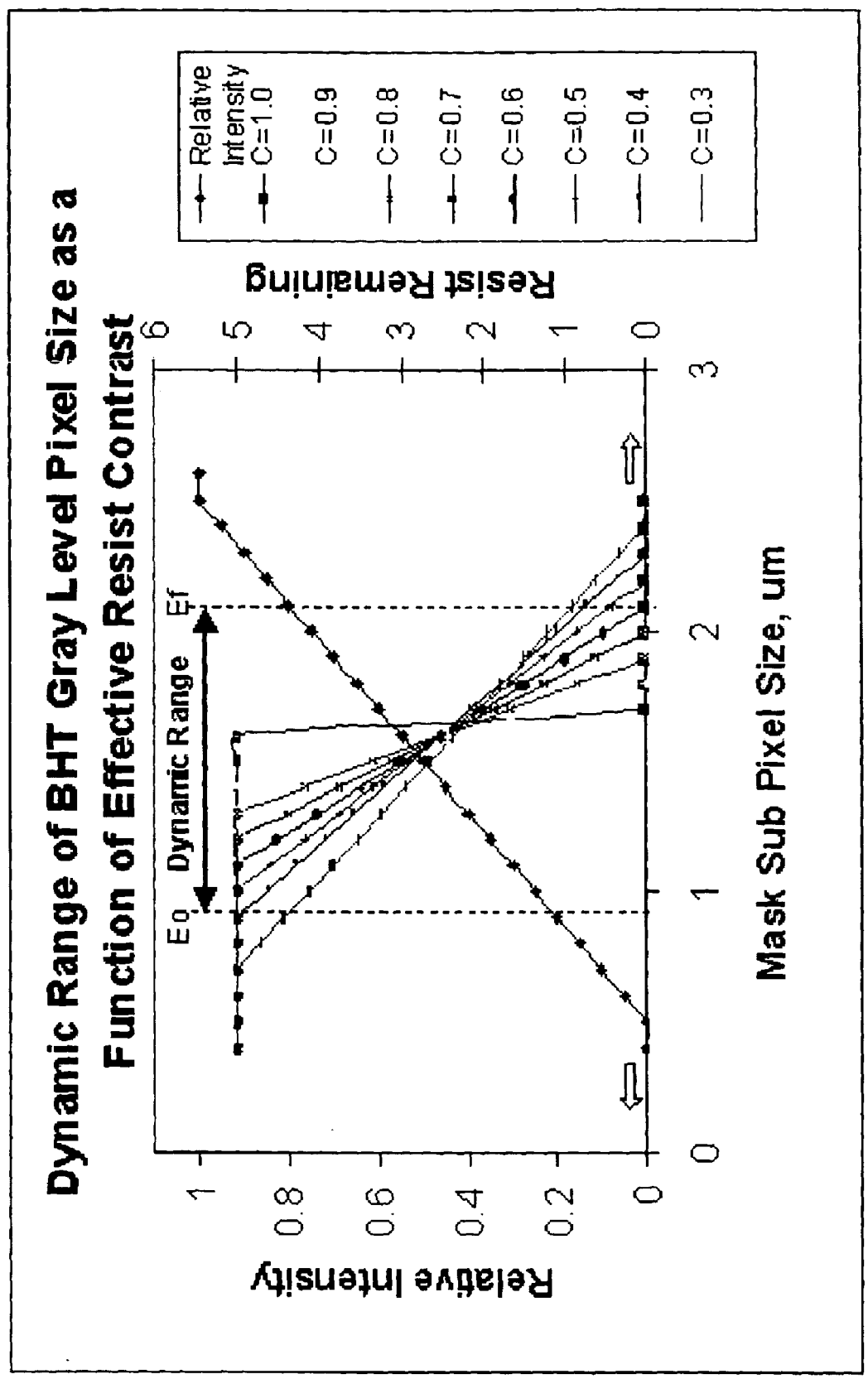
FIG. 8 shows the dynamic range of BHT gray levels pixel sizes as a function of photoresist contrast.

In many cases, these responses with the dynamic range $E_o$–$E_f$ will not be realized until after the BHT photomask is used and a calibrated response is observed with a particular design. Thus, it may be necessary, depending upon the BHT photomask design and the experience of the photomask designer, to fabricate a test BHT photomask and measure its response. Thereafter, a control design can be used to normalize the photoresist to a linear response, where the pixel size variation is calculated to be an equal change in transmitted light intensity throughout the gray levels. This process may require one or more iterations, depending upon the initial linearity achieved through the design. It should be noted, however, that as the mask designer becomes more experienced with this method and learns how certain photoresist materials react in response to certain designs, it may not be necessary to normalize the control design as more accurate results can be achieved from the initial design. Where measured and calibrated responses are required to fine tune the BHT photomask design, the mask designer should consider that the amplitude of transmitted light through a sub-resolution opening (e.g., sub-pixels 21$a$ and 21$b$) is proportional to the area of the opening. Accordingly, since the light intensity transmitted through the opening is proportional to the magnitude squared of the amplitude (i.e., $I \propto |A|^2$), then a linear change in wafer plane intensity is calculated by equation (4) as follows:

$$|A| \propto I^{1/2} \quad (4)$$

where A is the amplitude of the light at the mask plane and I is the intensity of the light at the wafer plane. Thus, when the sub-pixel is changed in one axis, there will be a linear change in intensity. It is noted that further calibration may be needed in cases where it is necessary to align three-dimensional features with two dimensional features in the same photomask. After photoresist calibration is completed, the variance from an expected response is measured. These values are then used to change the BHT photomask design, where each sub-pixel's size in each of the gray levels of the design is either enlarged or reduced in area in one axis only, in accordance with the disclosed method, to create the desired resist profile. As shown in FIG. 8, as the photoresist contrast decreases, the dynamic range of the photoresist process becomes wider. That is, the dynamic range $E_o$–$E_f$ of the photoresist process changes with changes in the photoresist contrast C as well as changes in the minimum resolution of the optical system being used. Thus, the wider the dynamic range, the greater the number of gray levels possible within a BHT design.

Additionally, the photomask maker should consider the type of optical system in the exposure tool that will be used to make the three-dimensional device. In this regard, it is preferable to use an optical system that has a high reduction ratio so as to enable the mask maker to print sub-pixels throughout the dynamic range and within the latitude of the photomask making process. Additionally, as the pixel size of the design decreases, write tools and processes having higher resolutions may be required, which can drive up the cost of the process. Thus, to avoid this problem, it is preferable to use a photoresist process having as large a dynamic range as possible, a relatively low contrast photoresist (e.g., AZ-4400 photoresist can be used to produce mirrors and lenses in single mode clad/core/clad polymer waveguides) and an optical system having a relatively low numerical aperture and high magnification. If, by contrast, the wafer has requirements to pattern very small structures, then a higher NA and/or lower process resolution variation K1 should be used, and the BHT photomask design should be modified to perform under these conditions. Additionally, if necessary, the wafer designer can use multiple mask levels and double exposure techniques at different NAs to achieve the optimum results.

Figure 10:
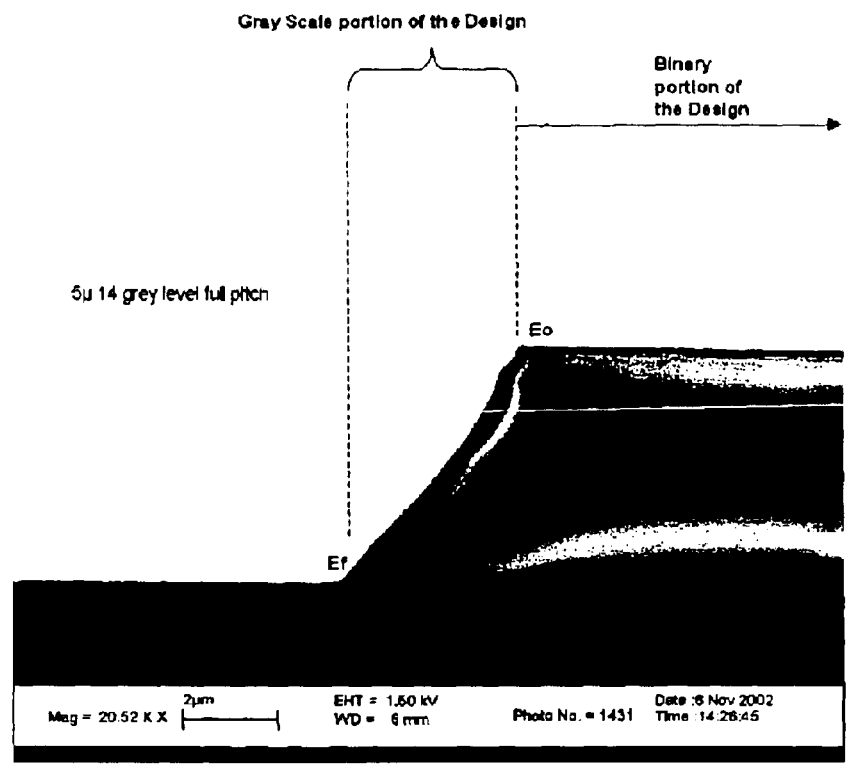
FIG. 10 is an SEM cross section of a printed BHT design on a wafer.
Figure 11:
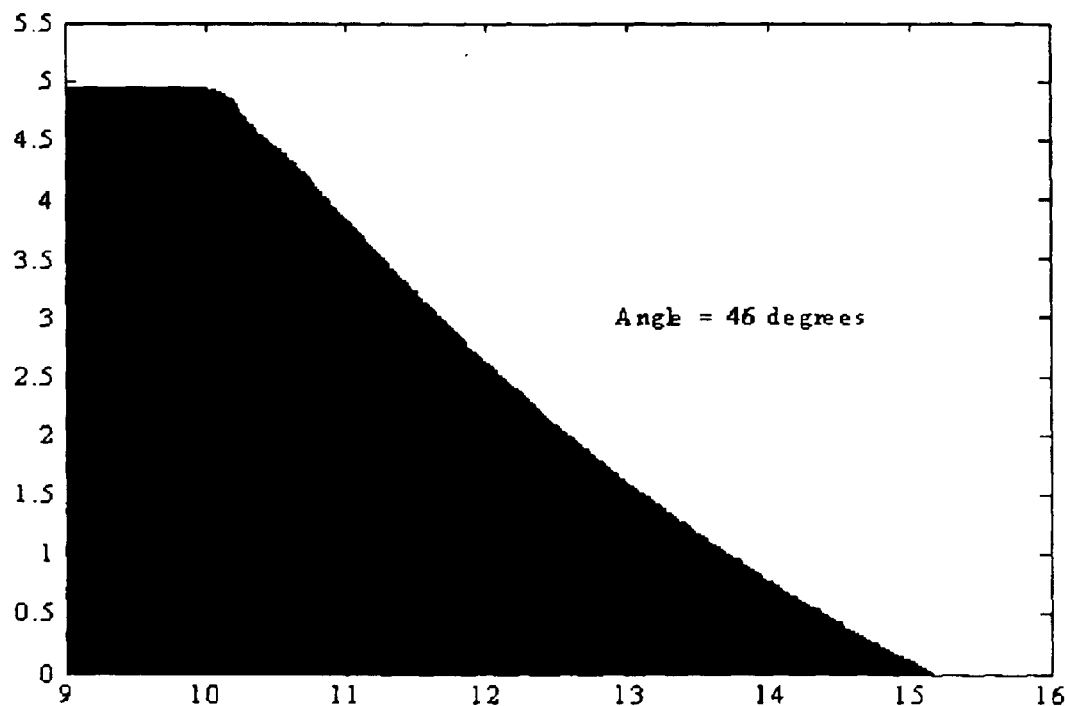
FIG. 11 shows an AFM profile of the photoresist slope of the ramp design shown in FIGS. 9 and 10.
Figure 12:
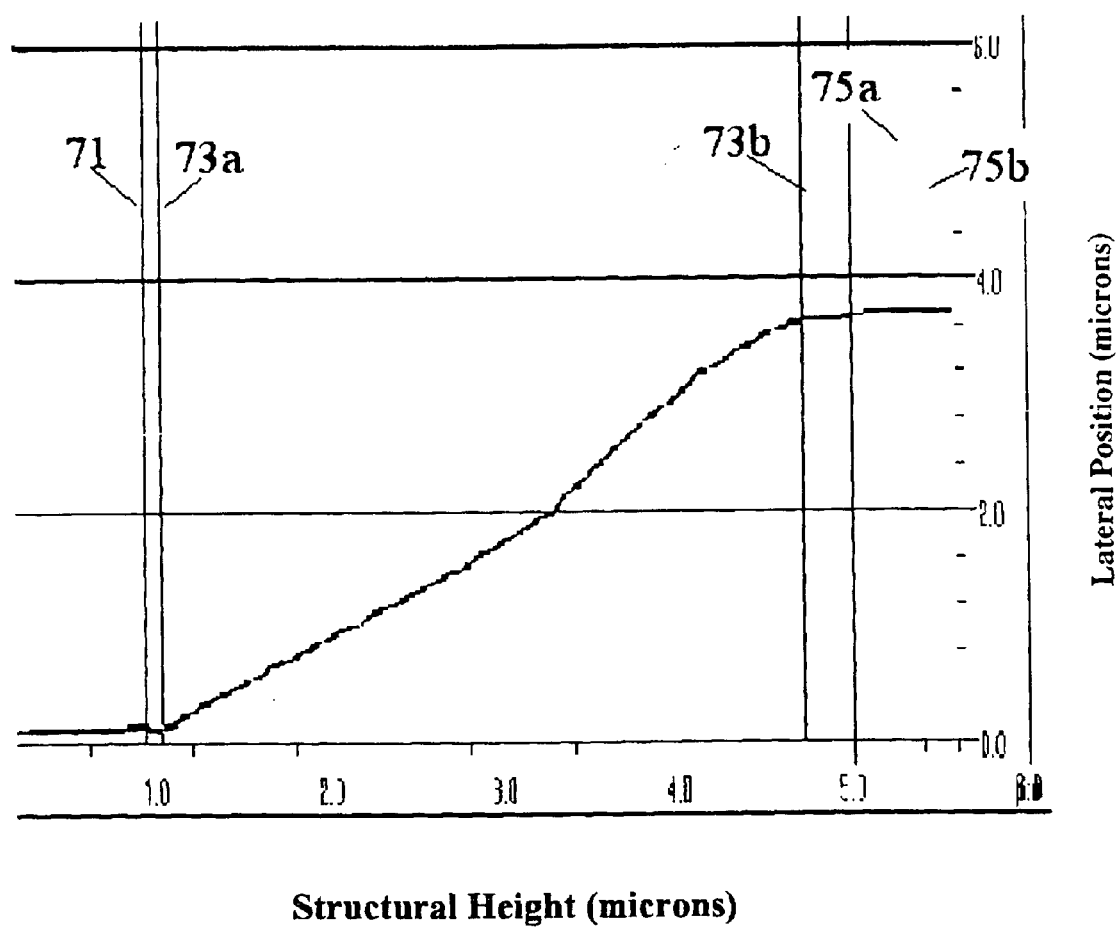
FIG. 12 shows a simulated photoresist profile from the design of FIGS. 9 and 13.

AZ-4400 photoresist has been shown to exhibit desirable transparency and photosensitivity at 365 nm. Referring to Table 2, typical flow for a process using the AZ-4400 resist is shown:

profile, as shown in the SEM of FIG. 10. The wafer was then etched to a predetermined depth to correspond to this resist profile. As shown in FIG. 11, a ramp of 45 degree±2 degrees (the actual measure angle was approximately 46.5 degrees) was printed on the wafer for this particular photonics application. Additionally, the resulting surface on the wafer was sufficiently smooth for this particular photonic applications, as the surface roughness was less than 20 nm, as shown in FIG. 11. Furthermore, in this embodiment, the mean slope (46 degrees) curvature and notching were accurately predicted through simulations of the BHT photomask design, as shown in FIG. 12. More particularly, as shown in FIG. 12, the simulations for this embodiment predicted the following: an angle of 89.74 degrees for the profile of this design between lines 71 and 73a where the horizontal and vertical changes in the profile were 166 nm and 7.214 Å, respectively; an angle of 46.5 degrees for the profile of this design between lines 73a and 73b where the horizontal and vertical changes were 3.689 μm and 3.501 μm, respectively; and an angle of 88.52 degrees for the profile of this design between lines 75a and 75b where the horizontal and vertical changes were 196 nm and 5.050 nm, respectively.

Figure 6A:
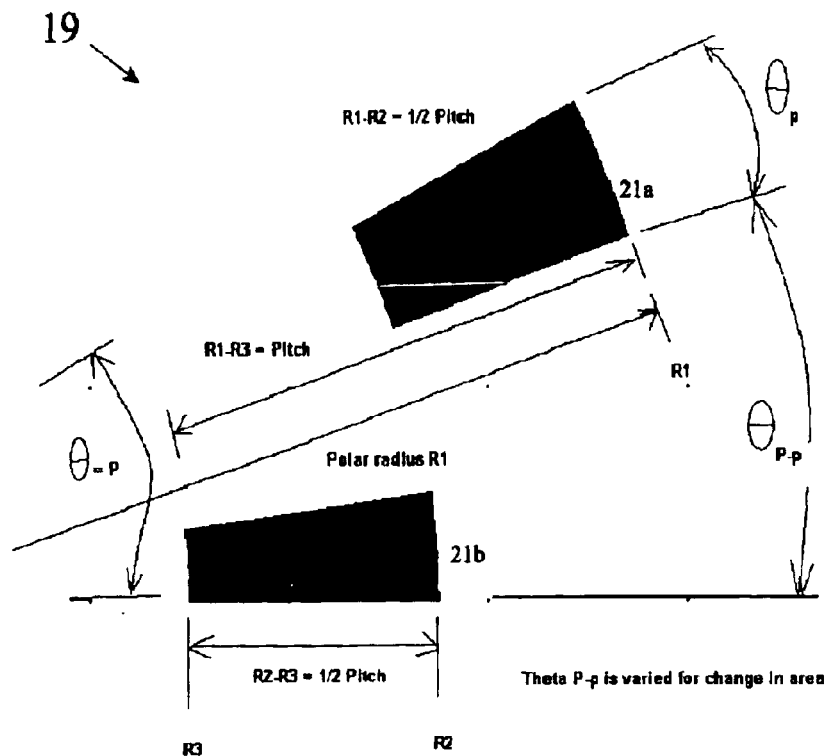
FIGS. 6a and 6b show a circular pixel divided into half-pitch sub-pixels whose area is varied along one axis only in accordance with the method of the present invention.
Figure 6B:
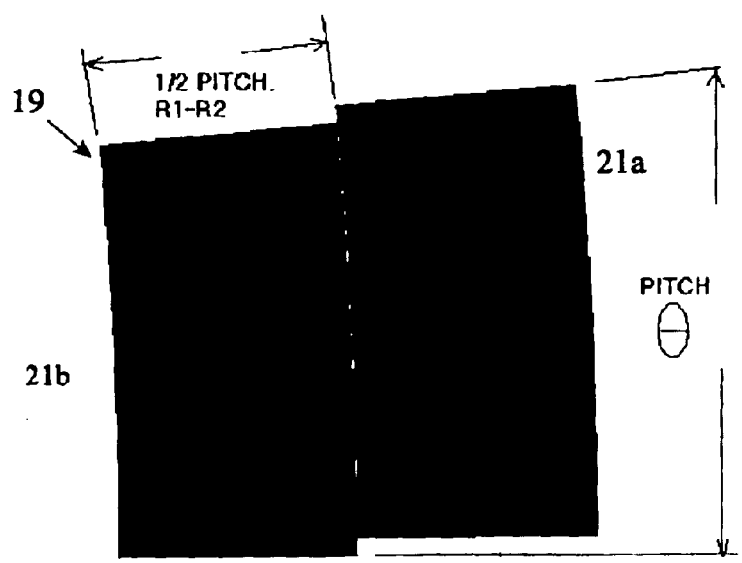
Figure 13:
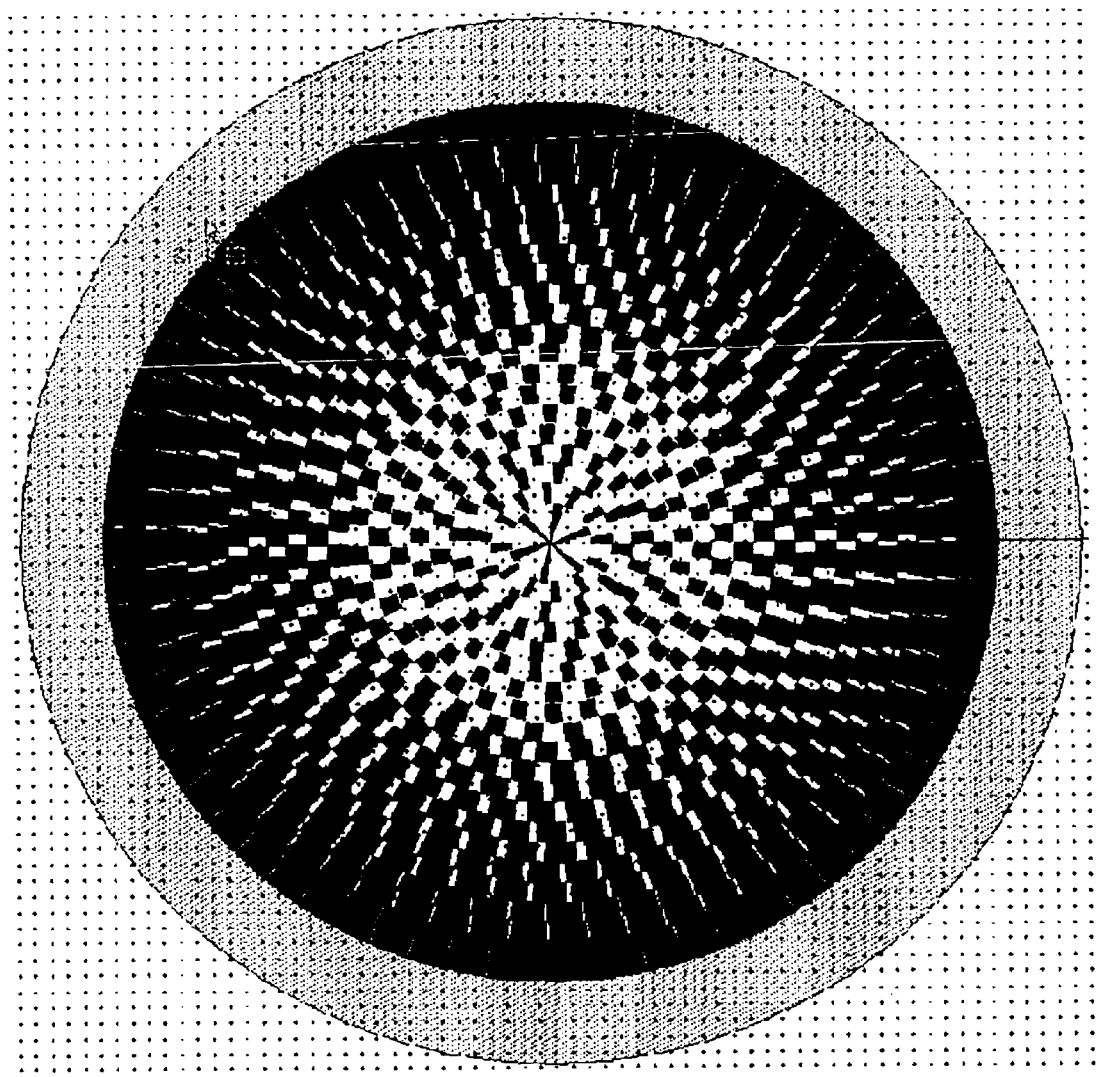
FIG. 13 shows circular ramp design for BHT photomask made in accordance with the method of the present invention as shown in FIGS. 6a and 6b.

FIG. 13 shows another embodiment of a BHT mask design made from the polar coordinate array made in accordance with the method of the present invention. This mask design could be used, for example, to fabricate micro-optical components, such as a micro-lens or a conical section. In this embodiment, a lens was printed using the circular BHT photomask design of FIG. 13 and the HPEC design methods of the present invention as shown in FIGS. 6a and 6b. This particular BHT photomask was used with a 365 nm optical tool having an NA of 0.4 and a sigma of 0.7.

TABLE 2

|  | Spin coat | Softbake | Expose | PEB | Develop | Rinse | Spin dry |
|---|---|---|---|---|---|---|---|
| Temp | RT | 90 C. | 240 mj | 110 C. | 20 C. | Gently | RT |
| Time | As required | 60 sec |  | 60 sec | 3 min |  | As required |
| Speed | As required |  |  |  | Bath |  | As required |
| Chemistry | AZ-4400 |  |  |  | AZ-300 MIF | DiH20 |  |

It is noted that care should be exercised in developing a photoresist coating process so as to avoid a sunburst striation pattern, which typically occurs in thick photoresist coatings. Further, the small thickness variations present in photoresist striations will be reproduced in the three-dimensional structures. Furthermore, the process contrast can be reduced by under-baking the photoresist. It was found that a post-exposure bake worked well to diffuse the photoresist development inhibiter, minimizing the patterning of the binary halftone step transitions.

Having described the overall method for designing and fabricating a BHT photomask and design considerations regarding the same, specific examples of the application of the method of the present invention are now described.

Figure 9:
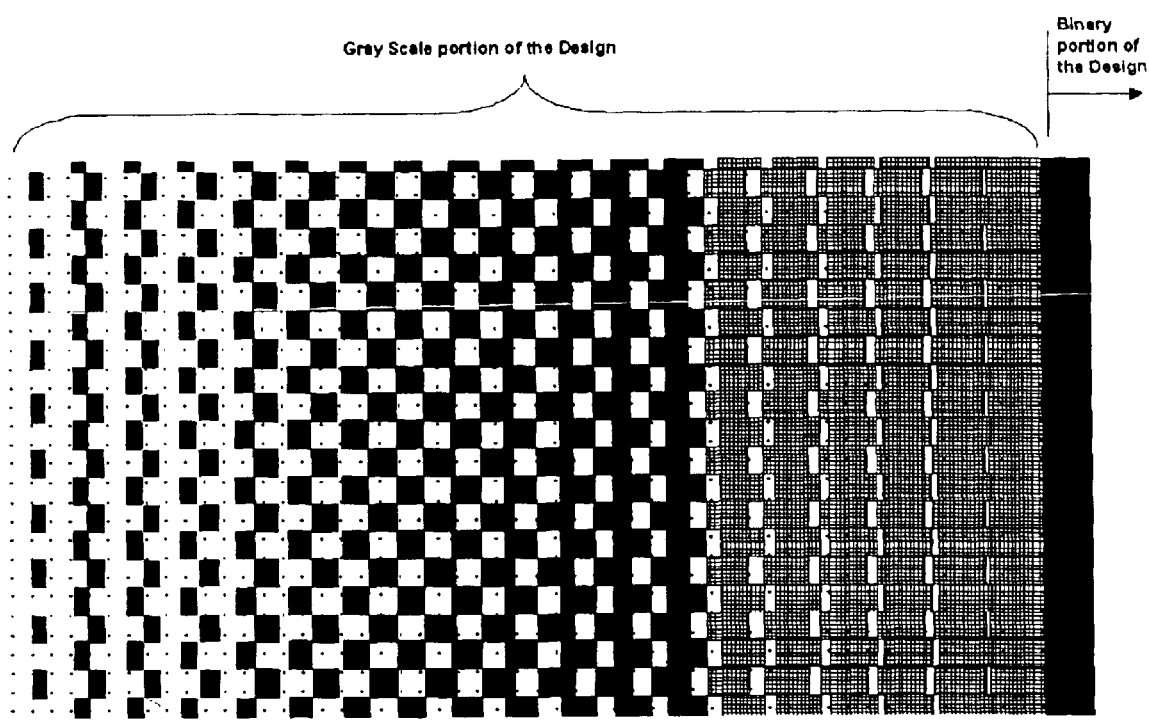
FIG. 9 shows a linear ramp design for a BHT photomask made in accordance with the method of the present invention as shown in FIGS. 5a and 5b.
Figure 14:
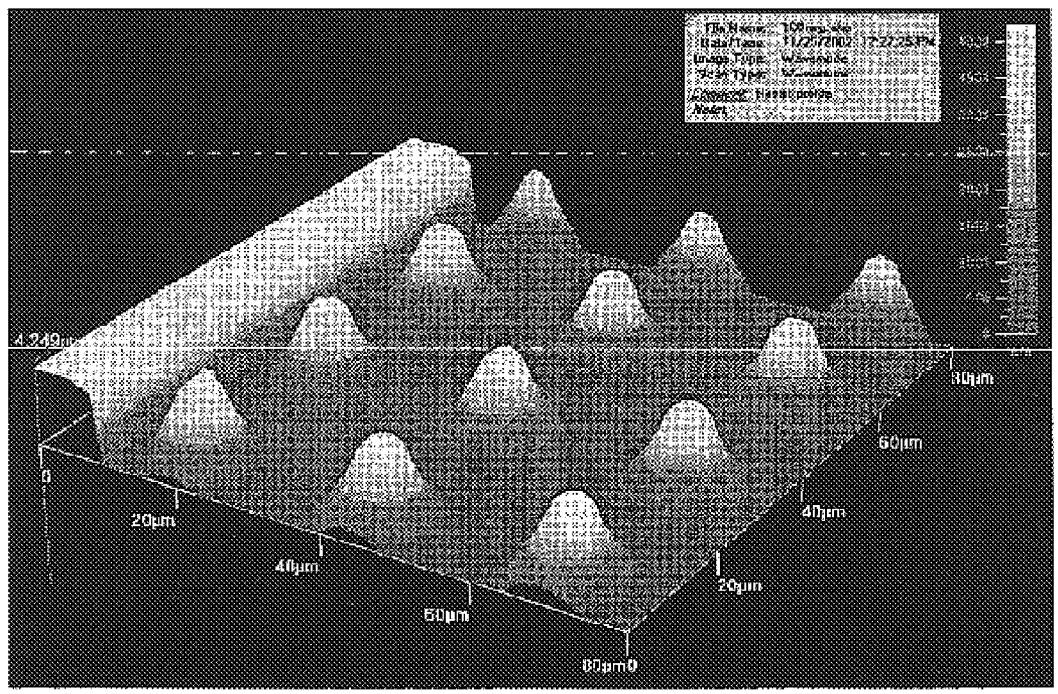
FIG. 14 is an AFM image of a lens array that was printed in accordance with the ramp design shown in FIG. 13.
Figure 15:
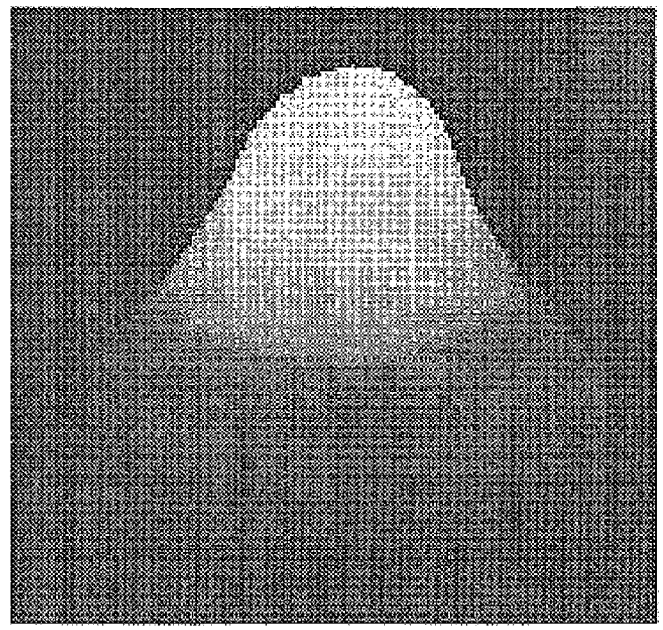
FIG. 15 shows a side view of one of the conical sections shown in FIG. 14.

Referring to FIG. 9, one embodiment of a BHT photomask design made in accordance with the method of the present invention is shown. More particularly, the gray levels in the design of FIG. 9 provide a ramp layout for a 45 degree micro-mirror, arrayed waveguide. When using the BHT photomask design of FIG. 9 and HPEC design method shown in FIGS. 5a and 5b with a 365 nm optical tool having an NA of 0.4 and a sigma of 0.7, the BHT photomask transmitted light through its openings in a continuous, linear fashion. Accordingly, photoresist on the wafer, when exposed, resulted in a substantially smooth and linear A substantially smooth and linear photoresist profile was formed using this design, as shown in the AFM images of FIGS. 14 and 15. As can be seen, conical section objects were produced and exhibited no sub-ripple effect in the device.

In another embodiment, the HPEC method of the present invention was used to print a specific sloped structure for a photonic application. In this embodiment, an Applied Materials ALTA 3500 laser writer was used on a 5 nm write grid. The ALTA 3500 laser writer was the best choice for this embodiment because it had a pixel-to-pixel critical dimension linearity at the wafer dimension which was similar to the write tool grid size. It is noted, however, that in other applications, more advanced e-beam and laser mask pattern generators (e.g., a CORE 2564, MEBES 4500 E-beam tool, etc.) having smaller grid sizes (e.g., 1.5 nm–2.5 nm) may also be used provided that the BHT photomask design can be fitted to the write tool grid and the desired gray levels can be achieved. Additionally, in this embodiment, a dry plasma chrome etch was used to process the BHT photomask. It is noted, however, wet etch techniques may be alternatively used. In such cases, response fidelity and gray scale performance will be limited by the write tool grid, and compromised by the mask bias. Irrespective of which etching technique and mask write tool is used, the linearity in the critical dimensions of the design must be maintained. Thus, to the extent the design exhibits non-linearity, such design should be corrected after the calibration of the wafer process is completed and compensated for in the BHT design. By using this type of process, mask dimensions can be controlled in a linear fashion for small sub-pixel sizes ranging from 0.4 $\mu$m to the full pixel size of 2.5 $\mu$m when the ALTA 3500 write tool is used.

In another embodiment, the HPEC method of the present invention is used to develop step and flash templates. In this regard, a BHT photomask is made in accordance with the HPEC design method of the present invention. Thereafter, the three-dimensional image defined by the photomask is transferred in a reduction lithography system to a second substrate to produce a second photomask with continuous tone (i.e., gray scale) patterns. This second mask serves as an imprinting or stamping template for imprint lithography applications. The second photomask should preferably be made from a rigid material capable of operating as a stamp. For example, the second photomask may be made from a variety of different rigid materials, including, but not limited to, fused silica, glass, metals, crystalline structures, plastics and any other rigid material now known or hereinafter developed. In this embodiment, the second photomask is used to stamp or mold a three-dimensional structure. This may be done using an imprint stepper such as a Molecular Imprints stepper or other known or hereinafter developed tools.

Figure 16:
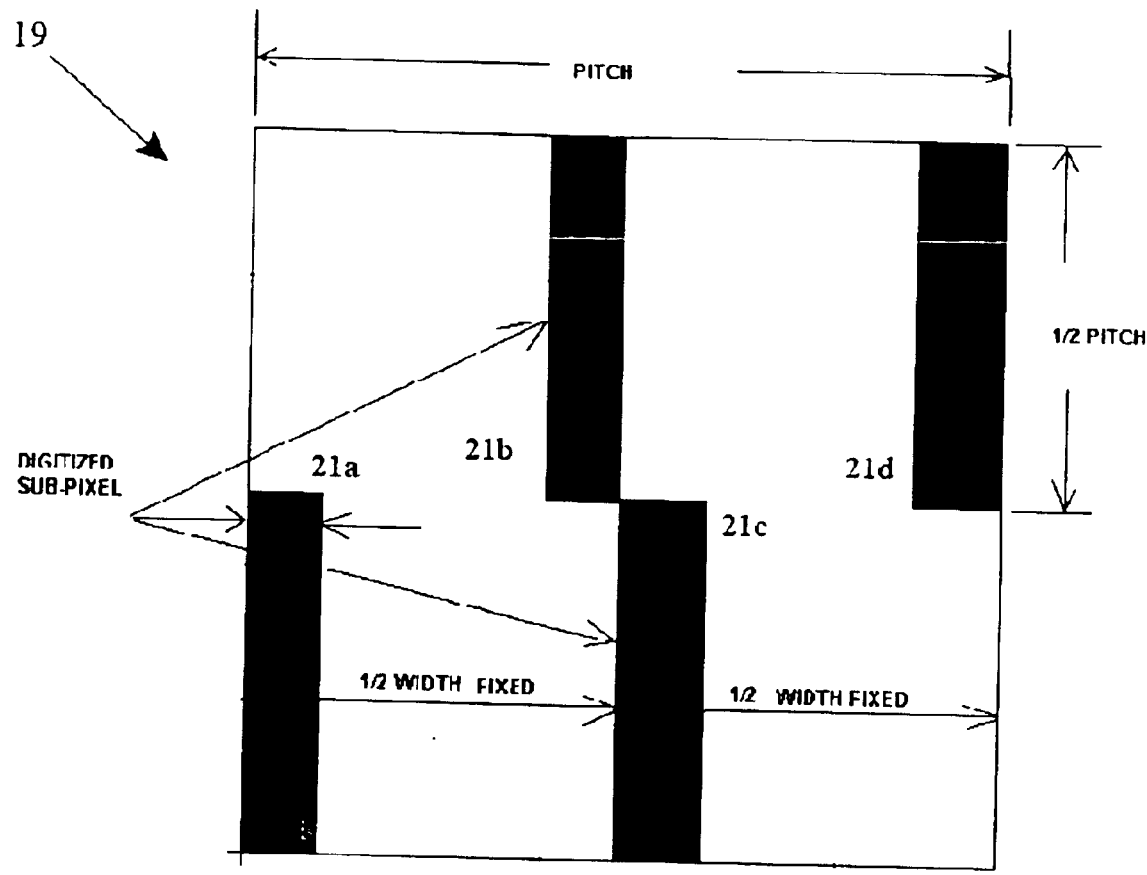
FIG. 16 is a pixel having multiple sub-pixels arrayed therein.

Now that the preferred embodiments of the present invention have been shown and described in detail, various modifications and improvements thereon will become readily apparent to those skilled in the art. For example, in addition to designing BHT photomasks, the HPEC method of the present invention could be modified to design gray scale photomasks (e.g., 0%, 50%, 100%, etc. transmissivity) to be used to make three-dimensional microscopic structures. Additionally, it is noted that each pixel can be divided into thirds, quarters, fifths, etc. to form three, four, five, etc. sub-pixels, respectively. In such cases, the area of each sub-pixel should be varied along one axis only in accordance with the methods described herein. For example, as shown in FIG. 16, a pixel 19 can be sub-divided in 4 sub-pixels 21a, 21b, 21c and 21d. In this example, each sub-pixel 21a–d is sub-divided to be one half of the pitch of the pixel 19 in a first axis with the width of each sub-pixel 21a–d being varied along a second axis. Moreover, it is noted that the HPECs designed in accordance with the method of the present invention could be combined on a photomask with other device designs (e.g., two dimensional binary structures such as an integrated circuit). The present embodiments are therefor to be considered in all respects as illustrative and not restrictive, the scope of the invention being indicated by the appended claims, and all changes that come within the meaning and range of equivalency of the claims are therefore intended to be embraced therein.

What is claimed is:

1. A binary half tone photomask comprising:
    a substantially transparent substrate;
    an opaque layer having a pattern formed therein, said pattern defined by at least one pixel, wherein each pixel is divided into sub-pixels having a variable length in a first axis and fixed length in a second axis.

2. The binary half tone photomask of claim 1, wherein said sub-pixels' area is smaller than the minimum resolution of an optical system of an exposure tool with which said binary half tone photomask is intended to be used.

3. The binary half tone photomask of claim 1, wherein said pixel is a square.

4. The binary half tone photomask of claim 3, wherein said sub-pixels have a height and a length, said height of each of said sub-pixels being approximately one-half of said pixel's pitch and said length of each sub-pixel being linearly varied in opposite directions along one axis only.

5. The binary half tone photomask of claim 4, wherein said pixels are arrayed to form a ramp layout for a photonic application.

6. The binary half tone photomask of claim 3, wherein said sub-pixels have a height and a length, said height of each of said sub-pixels being approximately one-third, one-fourth or one-fifth of said pixel's pitch and said length of each sub-pixel being linearly varied in opposite directions along one axis only.

7. The binary half tone photomask of claim 1, wherein said pixel is circular.

8. The binary half tone photomask of claim 7, wherein said sub-pixels have a radius and an arc length, said radius of each of said sub-pixels being approximately one-half of said pixel's pitch and said arc length of each sub-pixel being linearly varied in opposite directions along one axis only.

9. The binary half tone photomask of claim 7, wherein said sub-pixels have a radius and an arc length, said radius of each of said sub-pixels being approximately one-third, one-fourth or one-fifth of said pixel's pitch and said arc length of each sub-pixel being linearly varied in opposite directions along one axis only.

10. The binary half tone photomask of claim 1, wherein said pixel is oval-shaped.

11. The binary half tone photomask of claim 10, wherein said sub-pixels have a radius and an arc length, said radius of each of said sub-pixels being approximately one-half of said pixel's pitch and said arc length of each sub-pixel being linearly varied in opposite directions along one axis only.

12. The binary half tone photomask of claim 10, wherein said sub-pixels have a radius and an arc length, said radius of each of said sub-pixels being approximately one third, one-fourth or one-fifth of said pixel's pitch and said arc length of each sub-pixel being linearly varied in opposite directions along one axis only.

13. The binary half tone photomask of claim 1, wherein said at least one pixel is rectangular.

14. The binary half tone photomask of claim 13, wherein said sub-pixels have a height and a length, said height of each of said sub-pixels being approximately one-half of said pixel's pitch and said length of each sub-pixel being linearly varied in opposite directions along one axis only.

15. The binary half tone photomask of claim 13, wherein said sub-pixels have a radius and an arc length, said radius of each of said sub-pixels being approximately one-third, one-fourth or one-fifth of said pixel's pitch and said arc length of each sub-pixel being linearly varied in opposite directions along one axis only.

16. The binary half tone photomask of claim 1, wherein said opaque layer is chrome and said substantially transparent layer is quartz.

17. The binary half tone photomask of claim 1, further comprising a binary, resolved pattern in said opaque and substantially transparent layers.

18. The binary half tone photomaks of claim 17, wherein said binary, resolved pattern defines the shape of a two-dimensional integrated circuit design.

19. A method for designing a layout for a binary half tone photomask pattern to be used to fabricate a three-dimensional structure comprising the steps of:
    generating at least two pixels;
    dividing each of said at least two pixels into sub-pixels having a variable length in a first axis and fixed length in a second axis; and arraying said at least two pixels to form a pattern for transmitting light through said at least two pixels so as to form a continuous tone, aerial light image.

20. The method of claim 19, wherein said sub-pixel's area is smaller than the minimum resolution of an optical system of an exposure tool with which said binary half tone photomask is intended to be used.

21. The method of claim 19, wherein said at least one of said pixels is a square.

22. The method of claim 21, wherein said sub-pixels have a height and a length, said height of each of said sub-pixels being approximately one-half of said pixel's pitch and said length of each sub-pixel being linearly varied in opposite directions along one axis only.

23. The method of claim 21, wherein said sub-pixels have a height and a length, said height of each of said sub-pixels being approximately one-third, one-fourth or one-fifth of said pixel's pitch and said length of each sub-pixel being linearly varied in opposite directions along one axis only.

24. The method of claim 19, wherein at least one of said pixels is circular.

25. The method of claim 24, wherein said sub-pixels have a radius and an arc length, said radius of each of said sub-pixels being approximately one-half of said pixel's pitch and said arc length of each sub-pixel being linearly varied in opposite directions along one axis only.

26. The method of claim 24, wherein said sub-pixels have a radius and an arc length, said radius of each of said sub-pixels being approximately one-third, one-fourth or one-fifth of said pixel's pitch and said arc length of each sub-pixel being linearly varied in opposite directions along one axis only.

27. The method of claim 19, wherein said at least one is said pixels is oval-shaped.

28. The method of claim 27, wherein said sub-pixels have a radius and an arc length, said radius of each of said sub-pixels being approximately one-half of said pixel's pitch and said arc length of each sub-pixel being linearly varied in opposite directions along one axis only.

29. The method of claim 27, wherein said sub-pixels have a radius and an arc length, said radius of each of said sub-pixels being approximately one-third, one-fourth or one-fifth of said pixel's pitch and said arc length of each sub-pixel being linearly varied in opposite directions along one axis only.

30. The method of claim 19, wherein said at least one of said pixels is rectangular.

31. The method of claim 30, wherein said sub-pixels have a height and a length, said height of each of said sub-pixels being approximately one-half of said pixel's pitch and said length of each sub-pixel being linearly varied in opposite directions along one axis only.

32. The method of claim 30, wherein said sub-pixels have a height and a length, said height of each of said sub-pixels being approximately one-third, one-fourth or one-fifth of said pixel's pitch and said length of each sub-pixel being linearly varied in opposite directions along one axis only.

33. The method of claim 32, further comprising the step of compiling a mask pattern generator file.

34. The method of claim 33, wherein said design's hierarchy of gray levels is maintained in said file.

35. The method of claim 34, further comprising the step of determining the maximum number of gray levels that can be written for said binary half tone photomask design.

36. The method of claim 35, wherein said maximum number of gray levels is calculated by dividing said mask generator's writer grid value by said sub-pixels' size.

37. The method of claim 19, further comprising the step of using a mask pattern generator to write said at least one pixel and sub-pixels.

38. The method of claim 37, wherein said mask pattern is generated from a computer aided design system having all angle capability.

39. The method of claim 37, wherein said step of arraying further comprises the step of incorporating a layer in said design for each gray level.

40. The method of claim 19, further comprising the step of determining the possible number of gray levels that can be printed on a wafer device using said binary half tone photomask design.

41. The method of claim 40, wherein said possible number of gray levels is calculated by dividing said wafer's device length by an individual gray scale region's width.

42. The method of claim 19, further comprising the step of determining a dynamic range for a photoresist process to be used in making a three dimensional device using said binary half tone photomask design.

43. The method of claim 42, wherein said dynamic range varies from said sub-pixels' minimum opening size to said sub-pixels' maximum opening size.

44. The method of claim 42, further comprising the step of applying gray scale variations to said design within said dynamic range.

45. The method of claim 42, further comprising the step of generating a test photomask in accordance with said design.

46. The method of claim 45, further comprising the step of observing said test photomask's dynamic range by exposing a wafer having photoresist thereon to an exposure tool.

47. The method of claim 46, further comprising the step of normalizing said photoresist's response to said test mask to achieve a linear response in transmission of light through the photomask.

48. The method of claim 47, further comprising the step of calculating said pixel's size variation to be an equal change in transmitted light intensity throughout each gray level for said design.

49. The method of claim 48, further comprising the step of comparing said photoresist's response to an expected result.

50. The method of claim 47, wherein said linear response is achieved when the amplitude of light is proportional to the square root of said light's intensity.

51. A method for making a binary half tone photomask comprising the steps of:
    providing a binary photomask comprising a photoresist layer, an opaque layer and a substantially transparent layer in a lithography tool;
    exposing the photoresist layer to said lithography tool in accordance with a binary half tone photomask pattern on said photomask, wherein said pattern is defined by at least one pixel, wherein each of said at least one pixel is divided into sub-pixels having a variable length in a first axis and fixed length in a second axis;
    removing undesired portions of said photoresist;
    etching portions of said opaque layer underlying said removed photoresist portions; and
    removing remaining portions of the photoresist layer.

52. The method of claim 51, wherein said sub-pixel's area is smaller than the minimum resolution of an optical system of an exposure tool with which said binary half tone photomask is intended to be used.

53. The method of claim 51, wherein said at least one pixel is a square.

54. The method of claim 53, wherein said sub-pixels have a height and a length, said height of each of said sub-pixels being approximately one-half of said pixel's pitch and said length of each sub-pixel being linearly varied in opposite directions along one axis only.

55. The method of claim 53, wherein said sub-pixels have a height and a length, said height of each of said sub-pixels being approximately one-third, one-fourth or one-fifth of said pixel's pitch and said length of each sub-pixel being linearly varied in opposite directions along one axis only.

56. The method of claim 51, wherein said pixel is circular.

57. The method of claim 56, wherein said sub-pixels have a radius and an arc length, said radius of each of said sub-pixels being approximately one-half of said pixel's pitch and said arc length of each sub-pixel being linearly varied in opposite directions along one axis only.

58. The method of claim 56, wherein said sub-pixels have a radius and an arc length, said radius of each of said sub-pixels being approximately one-third, one-fourth or one-fifth of said pixel's pitch and said arc length of each sub-pixel being linearly varied in opposite directions along one axis only.

59. The method of claim 51, wherein said step of etching is performed by plasma dry etching techniques.

60. The method of claim 51, wherein said step of etching is performed by wet etching techniques.

61. A binary half tone photomask design layout comprising:
  at least two pixels, wherein each of said pixels is further defined by sub-pixels having a variable length in a first axis and fixed length in a second axis;
  a pattern formed by an array of said at least two pixels for transmitting light through said photomask so as to form a continuous tone, aerial light image.

62. The binary half tone photomask design layout of claim 61, wherein said sub-pixel's area is smaller than the minimum resolution of an optical system of an exposure tool with which said binary half tone photomask is intended to be used.

63. The binary half tone photomask design layout of claim 61, wherein said at least one of said pixels is a square.

64. The binary half tone photomask design layout of claim 63, wherein said sub-pixels have a height and a length, said height of each of said sub-pixels being approximately one-half of said pixel's pitch and said length of each sub-pixel being linearly varied in opposite directions along one axis only.

65. The binary half tone photomask design layout of claim 63, wherein said sub-pixels have a height and a length, said height of each of said sub-pixels being approximately one-third, one-fourth or one-fifth of said pixel's pitch and said length of each sub-pixel being linearly varied in opposite directions along one axis only.

66. The binary half tone photomask design layout of claim 61, wherein at least one of said pixels is circular.

67. The binary half tone photomask design layout of claim 66, wherein said sub-pixels have a radius and an arc length, said radius of each of said sub-pixels being approximately one-half of said pixel's pitch and said arc length of each sub-pixel being linearly varied in opposite directions along one axis only.

68. The binary half tone photomask design layout of claim 66, wherein said sub-pixels have a radius and an arc length, said radius of each of said sub-pixels being approximately one-third, one-fourth or one-fifth of said pixel's pitch and said arc length of each sub-pixel being linearly varied in opposite directions along one axis only.

69. The binary half tone photomask design layout of claim 61, wherein at least one of said pixels is oval-shaped.

70. The binary half tone photomask design layout of claim 69, wherein said sub-pixels have a radius and an arc length, said radius of each of said sub-pixels being approximately one-half of said pixel's pitch and said arc length of each sub-pixel being linearly varied in opposite directions along one axis only.

71. The binary half tone photomask design layout of claim 69, wherein said sub-pixels have a radius and an arc length, said radius of each of said sub-pixels being approximately one-third, one-fourth or one-fifth of said pixel's pitch and said arc length of each sub-pixel being linearly varied in opposite directions along one axis only.

72. The binary half tone photomask design layout of claim 61, wherein said at least one of said pixels is rectangular.

73. The binary half tone photomask design layout of claim 72, wherein said sub-pixels have a height and a length, said height of each of said sub-pixels being approximately one-half of said pixel's pitch and said length of each sub-pixel being linearly varied in opposite directions along one axis only.

74. The binary half tone photomask design layout of claim 72, wherein said sub-pixels have a height and a length, said height of each of said sub-pixels being approximately one-third, one-fourth or one-fifth of said pixel's pitch and said length of each sub-pixel being linearly varied in opposite directions along one axis only.

75. A gray scale photomask comprising:
  a substantially transparent substrate;
  an opaque layer having a pattern formed therein, said pattern defined by at least one pixel, wherein each pixel is divided into sub-pixels having a variable length in a first axis and fixed length in a second axis.

76. The gray scale photomask of claim 75, wherein said sub-pixels' area is smaller than the minimum resolution of an optical system of an exposure tool with which said gray scale photomask is intended to be used.

77. The gray scale photomask of claim 75, wherein said pixel is a square.

78. The gray scale photomask of claim 77, wherein said sub-pixels have a height and a length, said height of each of said sub-pixels being approximately one-half of said pixel's pitch and said length of each sub-pixel being linearly varied in opposite directions along one axis only.

79. The gray scale photomask of claim 77, wherein said sub-pixels have a height and a length, said height of each of said sub-pixels being approximately one-third, one-fourth or one-fifth of said pixel's pitch and said length of each sub-pixel being linearly varied in opposite directions along one axis only.

80. The gray scale photomask of claim 77, wherein said pixels are arrayed to form a ramp layout for a photonic application.

81. The gray scale photomask of claim 75, wherein said pixel is circular.

82. The gray scale photomask of claim 81, wherein said sub-pixels have a radius and an arc length, said radius of each of said sub-pixels being approximately one-half of said pixel's pitch and said arc length of each sub-pixel being linearly varied in opposite directions along one axis only.

83. The gray scale photomask of claim 81, wherein said sub-pixels have a radius and an arc length, said radius of each of said sub-pixels being approximately one-third, one-fourth or one-fifth of said pixel's pitch and said arc length of each sub-pixel being linearly varied in opposite directions along one axis only.

84. The gray scale photomask of claim 75, wherein said pixel is oval-shaped.

85. The gray scale photomask of claim 84, wherein said sub-pixels have a radius and an arc length, said radius of each of said sub-pixels being approximately one-half of said pixel's pitch and said arc length of each sub-pixel being linearly varied in opposite directions along one axis only.

86. The gray scale photomask of claim 84, wherein said sub-pixels have a radius and an arc length, said radius of each of said sub-pixels being approximately one-third, one-fourth or one-fifth of said pixel's pitch and said arc length of each sub-pixel being linearly varied in opposite directions along one axis only.

87. The gray scale photomask of claim 75, wherein said at least one pixel is rectangular.

88. The gray scale photomask of claim 87, wherein said sub-pixels have a height and a length, said height of each of said sub-pixels being approximately one-half of said pixel's pitch and said length of each sub-pixel being linearly varied in opposite directions along one axis only.

89. The gray scale photomask of claim 87, wherein said sub-pixels have a height and a length, said height of each of said sub-pixels being approximately one-third, one-fourth or one-fifth of said pixel's pitch and said length of each sub-pixel being linearly varied in opposite directions along one axis only.

90. The gray scale photomask of claim 75, wherein said opaque layer is chrome and said substantially transparent layer is quartz.

91. The gray scale photomask of claim 75 further comprising a binary, resolved pattern in said opaque and substantially transparent layers.

92. The gray scale photomaks of claim 91, wherein said binary, resolved pattern defines the shape of a two-dimensional integrated circuit design.

* * * * *